(12) United States Patent
Epmeier et al.

(10) Patent No.: US 11,274,819 B2
(45) Date of Patent: Mar. 15, 2022

(54) SUPPORT FOR LIGHT-EMITTING ELEMENTS AND LIGHTING DEVICE

(71) Applicant: LUMILEDS LLC, San Jose, CA (US)

(72) Inventors: Matthias Epmeier, Aachen (DE); Carsten Weber, Juelich (DE); Petra Wellmeier, Aachen (DE); Frank Giese, Aachen (DE)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 16/923,767

(22) Filed: Jul. 8, 2020

(65) Prior Publication Data

US 2021/0010666 A1 Jan. 14, 2021

(30) Foreign Application Priority Data

Jul. 8, 2019 (EP) ..................................... 19184871

(51) Int. Cl.
*F21V 23/02* (2006.01)
*F21V 23/00* (2015.01)
(Continued)

(52) U.S. Cl.
CPC .......... *F21V 23/023* (2013.01); *F21V 23/008* (2013.01); *F21V 23/06* (2013.01); *H01L 33/62* (2013.01); *F21Y 2115/10* (2016.08)

(58) Field of Classification Search
CPC ........ F21V 23/02; F21V 23/008; F21V 23/06; F21V 29/503; F21V 23/023; H01L 33/62;
(Continued)

(56) References Cited

U.S. PATENT DOCUMENTS 6,635,987 B1 * 10/2003 Wojnarowski ...... H01L 25/0753
257/E25.02
7,686,488 B2 * 3/2010 Inoue ..................... F21S 43/50
362/509
(Continued)

FOREIGN PATENT DOCUMENTS

EP 1760391 A2 3/2007
JP 2010-198847 A 9/2010
(Continued)

OTHER PUBLICATIONS

International Search Report dated Aug. 12, 2020 for PCT International Application No. PCT/EP2020/067672.
(Continued)

*Primary Examiner* — Peggy A Neils
(74) *Attorney, Agent, or Firm* — Volpe Koenig

(57) ABSTRACT

A support for light-emitting elements is disclosed. The support comprises a mounting section comprising at least one mounting face. The at least one mounting face has an arrangement direction and is configured to accommodate at least one light-emitting element along the arrangement direction. The support comprises a body section adjacent to the mounting section and having a length that extends parallel to the arrangement direction. The body section protrudes sidewards from the at least one mounting face. The support comprises a plurality of conductors connecting the body section to the at least one mounting face. Each contact section corresponds to a conductor. The plurality of conductors are a layered structure of conductors. An extension direction of the layered structure of the conductors extends substantially perpendicular to the arrangement direction of the at least one mounting face. The layered structure of conductors comprises an angled section.

16 Claims, 12 Drawing Sheets

(51) Int. Cl.
*F21V 23/06* (2006.01)
*H01L 33/62* (2010.01)
*F21Y 115/10* (2016.01)

(58) Field of Classification Search
CPC . H01L 25/167; H01L 25/0756; H01L 33/642; F21Y 2115/10; F21Y 2107/30; F21Y 2107/40; F21K 9/90; F21K 9/23; F21K 9/238; F21S 41/151; F21S 41/192; F21S 45/47; F21S 41/141
See application file for complete search history.

(56) References Cited

U.S. PATENT DOCUMENTS

| | | | | |
|---|---|---|---|---|
| 8,653,723 | B2* | 2/2014 | Cao | F21V 29/51 313/46 |
| 9,360,167 | B2* | 6/2016 | Imai | H01L 25/0753 |
| 9,945,541 | B1* | 4/2018 | Kuo | F21S 45/47 |
| 10,018,324 | B2* | 7/2018 | Nakagawa | F21S 41/194 |
| 10,788,182 | B2* | 9/2020 | Jo | B60Q 1/04 |
| 2003/0006423 | A1 | 1/2003 | Loh et al. | |
| 2004/0239243 | A1* | 12/2004 | Roberts | B60L 50/20 313/512 |
| 2007/0047251 | A1* | 3/2007 | Sanroma | F21K 9/23 362/545 |
| 2020/0041086 | A1* | 2/2020 | Mertens | F21V 19/003 |

FOREIGN PATENT DOCUMENTS

| | | |
|---|---|---|
| WO | 2009/037645 A2 | 3/2009 |
| WO | 2016/156463 A1 | 10/2016 |
| WO | 2020/048766 A1 | 3/2020 |

OTHER PUBLICATIONS

Written Opinion of the International Searching Authority dated Jan. 14, 2021 for PCT International Application No. PCT/EP2020/067672.

* cited by examiner

SUPPORT FOR LIGHT-EMITTING ELEMENTS AND LIGHTING DEVICE

CROSS REFERENCE TO RELATED APPLICATIONS

This application claims the benefit of EP Patent Application No. 19184871.2, filed Jul. 8, 2019, which is incorporated by reference as if fully set forth.

FIELD OF INVENTION

The present disclosure relates to a support for light-emitting elements in a lighting device, in particular comprising a layered structure, for improved heat transport and optical characteristics in applications such as automotive lighting.

BACKGROUND

Recently, efforts have been made to replace traditional light sources such as incandescent light sources comprising a wire filament by lighting devices comprising light-emitting elements such as LEDs. For some specific applications, for instance in automobile lighting, it is desirable to perform a "retrofitting" of such lighting devices. For example, it is advantageous if only the traditional light source such as an incandescent light bulb is replaced by a LED lighting device, while the remaining elements of the lamps, e.g. optical elements such as reflector cups and lenses, do not require replacement. Hence, there are efforts to offer such retrofitting lighting devices that represent a 1:1 replacement for traditional standard light sources, for example H7 halogen bulbs.

Configuring lighting devices for retrofitting traditional light sources is however challenging. Firstly, as the lighting device is intended to make use of the same optical elements as a traditional light source, the illumination pattern of the traditional light source has to be mimicked closely by the arrangement and specification of the light-emitting elements. For example, it may be required that LEDs are arranged in a manner representing the shape of a filament of an incandescent light source, with LEDs being arranged along an arrangement direction. Secondly, the heat transport from the LEDs has to be effective to ensure a long lifetime of the LEDs, which is particularly challenging as reproducing the illumination pattern of the traditional light source may require arranging multiple LEDs very close to each other, which may lead to concentration of heat within a small volume. For retrofitting applications such as in automotive lighting, a high light output is required, which also leads to a high heat output of the light-emitting elements. Thirdly, the light-emitting elements have to be provided with electrical energy in an efficient manner, wherein additional heat generation in the electrical connections should be reduced.

There have been attempts to provide supports for LEDs for retrofit applications based on printed circuit boards (PCBs), which may provide electrical connection of the LEDs with an effective heat transport. However, PCBs restrict the arrangement of LEDs to a substantially flat or two-dimensional shape, so that a mimicking the shape of a filament with PCBs as a support is unsatisfactory.

Other supports from the prior art still require to arrange a significant number of LEDs connected in parallel on conductors with a small cross-sections, such that the heat transport may still be optimized further.

WO 2016/156463 A1 refers to a LED module which comprises a heat sink portion and a LED arrangement mounted on the heat sink portion at a LED mounting face. The heat sink portion has a shaped sheet metal carrier that forms a 3D shape, which is basically a pyramid with a rectangular base. The mounting surface is defined by a flat region on the top of the pyramid-formed carrier.

EP 1 760 391 A2 refers to a light emitting diode bulb comprising a base, a printed circuit board contained with said base and a plurality of electrical connectors. A light emitting diode is electrically connected between the conductive plates adjacent to a second end on each of the plurality of electrical connectors. The electrical ends of the connectors comprise an upper, substantially planar surface and an undercut surface, with the light emitting diodes being positioned on the undercut surfaces.

WO 2009/037645 A2 discloses a LED package for use in a lamp comprising a substrate with lighting elements, which are arranged regular in a line and totally covered by an optical element.

US 2003/0006423 A1 discloses a concentrically leaded power semiconductor device package which includes an inner conductor, an intermediate conductor and an outer conductor. One semiconductor device is attached to the inner conductor. Attached along the flat face of the inner conductor are a number of semiconductor devices.

JP 2010198847 A refers to a vehicle headlight wherein a light source is mounted on the front of a first of a first section of the flexible board and a lining member is connected with a rear face of the first section.

SUMMARY

However, it is a drawback of known solutions that current retro fit lighting modules lack the possibility to combine multiple functions in one light source. Further dynamics by dimming or boosting individual LEDs is not possible.

It is thus, inter alia, an object of the invention to provide a support for light-emitting elements that provides effective heat transport and electrical conduction when at least one light-emitting element is arranged on the support. The support also may provide for various shapes and in particular three-dimensional arrangements of light-emitting elements, allowing for optical properties desirable in retrofitting applications. The invention further relates to a lighting device that improves heat transport and the illumination pattern in particular for retrofitting applications. The invention further relates to a method for producing such a lighting device.

According to a first exemplary aspect of the present invention, a support for light-emitting elements is proposed, the support comprising: a mounting section with at least one mounting face, wherein the at least one mounting has an arrangement direction and is configured for accommodating at least one light-emitting element arranged along the arrangement direction; a body section arranged adjacent to the mounting section; and conductors for providing electric connection from the body section to the at least one mounting face; wherein the at least one mounting face comprises at least two contact sections along the arrangement direction, each contact section corresponding to a conductor, wherein the body protrudes sidewards from the at least one mounting face, and wherein a voltage is applied between any of the at least two contact sections when the body section is connected to a power source.

According to a second exemplary aspect of the present invention, a lighting device is proposed comprising: a support according to the first exemplary aspect of the present invention; and at least one light-emitting element mounted along the arrangement direction of the at least one mounting face, wherein the at least one light-emitting element is in electrical contact to the at the least two contact sections.

According to a third exemplary aspect of the present invention, a method for producing a lighting device is proposed, in particular a lighting device according to the second exemplary aspect of the present invention, the method comprising: providing a support according to the first exemplary aspect of the present invention; mounting at least one light-emitting element along the arrangement direction of the at least one mounting face, wherein the at least one light-emitting element is brought into electrical contact to the contact sections.

Exemplary embodiments of the first, second, and/or third exemplary aspect of the present invention may have one or more of the properties and/or features described below:

The support comprises a mounting section with at least one mounting face. The mounting face(s) may provide a suitable mounting surface for one or more light-emitting elements. For instance, the mounting face(s) may be at least partially flat or planar to provide an area suitable to accommodate a light-emitting element such as a LED and/or an LED die. The at least one mounting face has an arrangement direction and is configured for accommodating at least one light-emitting elements arranged along the arrangement direction. The arrangement direction may correspond to an extension direction of the at least one mounting face and/or the at least one light emitting element. For instance, the arrangement direction may correspond to a longest dimension of the at least one mounting face and/or the at least one light emitting element. The at least one mounting face may in particular be configured such that multiple light-emitting elements may be arranged along a line, e.g. a straight line, wherein the arrangement direction corresponds to the orientation of the line of light-emitting elements. In some embodiments, the at least one mounting face may be configured to accommodate only a single light-emitting element, wherein the light-emitting element has for instance an elongated (rectangular) shape with the arrangement direction corresponding to the direction of elongation.

In embodiments of the support for use in lighting devices that are intended to replace incandescent light sources with a filament, the arrangement direction may correspond to the extension direction of the filament, i.e. the direction of the longest dimension of the filament. The at least one mounting face may then accommodate at least one light-emitting element to effectively mimic the illumination of an incandescent light source.

A body section is arranged adjacent to the mounting section, wherein in particular the body section is in thermal contact to the mounting section, such that e.g. heat generated by one or more light-emitting elements mounted on the at least one mounting face may be transferred from the mounting section to the body section. The body section may in particular comprise a volume and/or surface configured to provide heat dissipation suitable for the heat generated by light-emitting element(s) and to provide cooling for the light-emitting element(s).

The conductors may provide an electric connection from the body section to the at least one mounting face. The body section may for instance be connected to a power source, e.g. by means of a socket. The conductors may provide a transfer of electrical power from the body section to the mounting section and therefore to one or more light-emitting elements mounted on the at least one mounting face. Further, the body section may act both as a heat sink as well as a heat conductor to the environment of the support.

The at least one mounting face comprises at least two contact sections along the arrangement direction. Contact sections may for example be configured as contact patches or contact areas on the surface of the mounting face(s) that allow for an electrical contact with a light-emitting device, for instance by soldering or by means of a conductive adhesive. Each contact section corresponds to a conductor and is therefore electrically connected to the body section such that a for instance a voltage may be applied between neighboring contact sections when the body section is connected to a power source.

As already mentioned above, the body section may provide an electrical connection to the at least one mounting face and may act simultaneously as a heat sink as well as a heat conductor, which is particularly advantageous when light-emitting elements with a high heat output are used, e.g. LED light sources for high current applications such as automotive head lighting. As the body section protrudes sidewards from the at least one mounting face, in particular the volume of the body section is enlarged, and the body section provides significantly improved heat transfer from the mounting section. The electrical conductivity may also be improved due to an enlarged cross section of the conductors, allowing to supply the light-emitting elements accommodated on the at least one mounting face with high currents. Further, it has been found that the support according to the invention may allow for a close mimicking of the illumination of traditional light sources such as incandescent light sources based on a filament. In particular, the illumination pattern of light sources such as halogen bulbs may be reproduced very closely with light-emitting elements (e.g. at least one LED) based on the support. Hence, the support according to invention may provide an optimization of optical, thermal, and electrical aspects of retrofitting light sources.

Under "protruding sidewards", it may in particular be understood that when a viewer faces the at least one mounting face (for instance in a direction perpendicular to the surface of the mounting face), the body section extends at least beyond one edge of the at least one mounting face. For instance, the body section may protrude sidewards relative to the arrangement direction in that the body section extends beyond at least one edge of the at least one mounting face, wherein the at least one edge extends substantially parallel to the arrangement direction.

A voltage is applied between any of the at least two contact sections when the body section is connected to a power source. For instance, in case of two contact sections a voltage may be applied between those two contact sections. In case of more than two, e.g. three contact sections, a voltage may be applied any two of the three contact sections. For instance, a voltage may be applied between a first and second contact section, and/or between the first and a third contact section, and/or between the second and the third contact section, to name but a few non-limiting examples. Further, in case of a plurality of contact sections (e.g. at least two contact sections), it is enabled to for instance apply a voltage applied between two different contact sections when the body section is connected to a power source. In this way, in case of a plurality of light-emitting elements being arranged on the mounting section, individual combinations of the plurality of light-emitting elements may be addressed to emit light when the body section is connected to a power source.

According to an exemplary embodiment of the invention, the support further comprises an insulating section separating two neighboring contact sections of the of at least two contact section. Thus, each neighboring contact section of the at least two contact sections may be separated by an insulating section. Such an insulating section may be formed by an insulator.

According to an exemplary embodiment of the invention, a further voltage is applied between any of at least two further contact sections of the at least two contact sections when the body section is connected to a power source. It will be understood that in this exemplary embodiment, the support comprises at least four contact sections. Thus, a first voltage and, e.g. in parallel, a second voltage, may be applied respectively between any of the contact sections when the body section is connected to a power source. The first voltage and the second voltage may be of a different value.

According to an exemplary embodiment of the invention, at least one contact section is not connected so that a voltage is not applied to said at least one contact section when the body section is connected to a power source. When a voltage is applied between at least two contact sections comprised by the support, and at least one contact section is required to be not connected, it will be understood that then the mounting section comprises at least three contact sections. While between any two contact sections can be applied with a voltage when the body section is connected to a power source, at least one contact section may be not connected so that a voltage or the voltage is not applied.

According to an exemplary embodiment of the invention, the body section further comprises at least one sensor, wherein the at least one sensor is coupled to at least two contact sections (e.g. said at least two contact sections of the mounting section) so that information gathered by the at least one sensor is at least readable via the coupling. The at least one sensor may be configured to gather (e.g. measure) information. The gathered information can be read, e.g. by another entity to be comprised by or connectable to the support so that the information gathered by the at least one sensor can be utilized by the other entity. Further, via the coupling, the at least one sensor may be controllable, e.g. triggering that the at least one sensor initiates to gather (e.g. measure) information, and/or that the at least one sensor is triggered to output gathered information, or a combination thereof, to name but a few non-limiting examples.

According to an exemplary embodiment of the invention, the at least one sensor is located on a top side, and/or on at least one side of at least three sides of the body section connected at least partially with each other. In principle, the at least one sensor may be mounted in any position to the support, as far as reasonable. This may for instance refer to specific kinds of the at least one sensor. For instance, in case a temperature information indicative of a temperature in a vicinity of the at least one light emitting element, it may for instance be considered to be reasonable to position the at least one sensor in the vicinity of the at least one light emitting element. As far as the at least one sensor can be coupled so that information gathered by the at least one sensor are readable, the actual position of the at least one sensor may be selected to a user desire.

According to an exemplary embodiment of the invention, the at least one sensor is at least one temperature sensor to gather a temperature respectively a temperature information of the support, or of one or more components comprised by the support. An example of at least one temperature sensor is a thermocouple.

According to a next exemplary embodiment of the invention, the at least one mounting face is configured for accommodating multiple light-emitting elements arranged along the arrangement direction. The light-emitting elements may for example be arranged along the arrangement direction in a line, in particular in a straight line to represent the extension direction of a filament. The at least one mounting face may comprise at least three alternating contact sections along the arrangement direction, each alternating contact section corresponding to a conductor and being separated by an insulating section. In an embodiment, the alternating contact sections are configured to provide alternating polarities. For instance, the polarities between neighboring contact sections are reversed in respect to each other (such as sequences like +/−/+ or −/+/−). Additionally or alternatively, at least one contact sections may be not connected (nc) so that sequences like +/nc/− or −/nc/+ are enabled. The light-emitting elements may be brought into contact to two contacting sections with different polarities, e.g. light-emitting elements may be brought into contact to two neighboring alternating contacting sections. By enabling to apply a voltage between any of the at least two contact sections, multiple lighting functions, such as low beam, DRL (Daytime Running Light), PL (Position Light), or a combination thereof, and/or providing beam dynamics, such as boosting, dimming, fast switching, or a combination thereof with the same support is enabled. It will be understood that the specific lighting function may depend upon the specific light-emitting elements, or the combination of multiple light emitting elements that are comprised by the support.

For example, multiple light-emitting elements may be arranged along the arrangement direction in a line, e.g. in a "1×N"-configuration. Each light-emitting element of the "1×N"-configuration arranged along the arrangement direction may be in contact to a different pair of alternating contact sections. Configurations with multiple light-emitting elements being in contact to the same pair of alternating contact sections are also possible, e.g. for arrays of light-emitting elements such as "2×N"-configurations, "3×N"-configurations or even larger arrays.

By providing at least three alternating contact sections along the arrangement direction, heat transfer and electrical conduction to light-emitting elements mounted on the mounting faces may be improved in that the number of conductors providing heat transfer and electrical conduction is increased, and heat may in particular be transferred effectively to the body section. For example, in a "1×N"-configuration with N light-emitting elements arranged along the arrangement direction, N+1 contact sections and N+1 conductors may be provided to optimize heat transfer. The support according for the invention therefore may offer improved efficiency and lifetime of light-emitting elements compared to simple columnar shapes of the prior art, in which multiple light-emitting elements are connected in parallel and heat transfer is effected via the same conductors. Providing at least three alternating contact sections also opens the possibility to operate single or multiple light-emitting elements independently of each other.

According to another exemplary embodiment of the invention, the mounting section comprises at least two mounting faces. By using multiple mounting faces, the illumination provided by a filament can be mimicked with higher precision. For instance, the arrangement direction of each mounting face may be substantially parallel to each other, wherein the mounting faces represent different sides of the filament. In particular, at least two mounting faces are arranged adjacent to each other, such that a continuous area for mounting light-emitting elements is obtained. At least two mounting faces may be arranged substantially parallel to each other, for example, to obtain several areas of illumination towards the same direction and in particular for mimicking light sources with multiple filaments. At least two mounting faces and in particular adjacent mounting faces may be arranged at an angle to each other, for instance with an enclosing angle in the range of 45° to 135°, in particular 45° to 75° or substantially perpendicular to each other. For instance, the mounting faces arranged at an angle to each other may represent different sides of a filament and/or provide an increased angle of illumination.

According to another exemplary embodiment of the invention, the mounting section comprises three mounting faces. Further, one of the three mounting faces may be arranged between the other two mounting surfaces and may optionally be arranged directly adjacent to the other two mounting faces. The mounting section may for example comprise four sides, with three sides providing the mounting faces and the fourth side providing contact to the body section. In particular, one of the three mounting faces may be arranged with an enclosing angle of 45° to 135°, in particular 45° to 75° or substantially perpendicular to the other two mounting faces.

According to an exemplary embodiment of the invention, at least one light-emitting element of the multiple light-emitting elements is configured to emit a light of different wavelength than one or more of the other light-emitting elements of the multiple light-emitting elements. The different wavelength and/or intensities with which a respective light-emitting element may emit light may enable that the multiple light emitting elements together emit an additive color according to the mixture of the different wavelength.

According to an exemplary embodiment of the invention, the at least one light emitting element configured to emit a light of different wavelength is further configured to emit a light with a wavelength representing a color of yellow or blue. In case at least one light-emitting element of the multiple light-emitting elements are configured to emit a light with a wavelength representing a color of yellow or blue, it is enabled that light of a known light bulb can be mimicked, wherein a mixture of light comprising the color of blue is referred to as cold-white, and a mixture of light comprising the color of white is referred to as warm-white.

According to an exemplary embodiment of the invention, the body section has at least in sections an increasing cross-sectional area with increasing distance from the mounting section. With this, the optical properties of a lighting device based on the support may be further improved in that a smaller amount of light emitted by light-emitting elements accommodated in the mounting section is blocked by the body section, while the body section may be provided with a high volume and surface area to optimize the thermal properties. In particular, when a triangular cross section is provided at least in sections with the mounting section being arranged on an edge of the triangular cross section, the volume and surface area of the body section is optimized while the amount of light blocked or reflected by the body section can be controlled by choosing an appropriate opening angle of the triangular cross section. The opening angle of the triangular cross section may for instance be chosen for a large volume of the body section (larger opening angles) or larger angles of illumination (smaller opening angles).

In some embodiments, the triangular cross section may have an opening angle of 0° to 90°, i.e. >0° to 90°. In this range, the thermal properties of the body are sufficient for many applications while providing an angle of illumination that is suitable in particular for retrofitting applications. When an opening angle in the range of 30° to 45° is chosen, the angle of illumination may be improved. For applications with higher heat generation requiring a higher heat transfer by the body section, opening angles in the range of 50° to 70°, in particular about 60° have been found to be advantageous.

The mounting section and the body section comprise a layered structure of conductors and preferably also of insulating layers. A layered structure represents a particularly simple configuration to provide the mounting section and/or body section with conductors, wherein in particular the mounting section and/or body section may integrally be formed by the layered structure. The conductors may also form at least part of the contact sections, such that the mounting face(s) may also comprise a layered structure of contact sections.

According to another exemplary embodiment of the invention, the conductors comprise metallic sheet material. By using sheet material, a layered structure of the body section and/or mounting section may be provided in a particularly simple manner, wherein the support may be produced cost-effectively. For instance, the size and thickness of sheet material may be chosen according to the requirements in electrical and thermal conductivity of the support. Different metallic materials are possible as a basis for the sheet material. In an embodiment, the metallic sheet material is based or consists of copper. Copper may provide very high electrical and thermal conductivity in view of acceptable material costs.

According to another exemplary embodiment of the invention, the metallic sheet material comprises a main face and side faces, wherein each of the contact sections is respectively at least partially formed by a side face of metallic sheet material. The main face of the sheet material may be the surface of the sheet material with the largest dimensions. When the contact sections are formed by a side face of the metallic sheet material, for instance, the contact sections may have appropriate (small) dimensions for an electrical and thermal contact to at least one light emitting element, while the metallic sheet material may provide a large volume and cross section for electrical and thermal transport.

An extension direction of the layered structure of conductors and preferably also of insulating layers extends substantially perpendicular to the arrangement direction of the at least one mounting face in the mounting section. In particular, the layered structure is based on metallic sheet material extending substantially perpendicular to the arrangement direction of the at least one mounting face. The extension direction in this sense may represent a direction that is parallel to the layers of the layered structure. As the electrical and thermal transport may predominantly be provided by the conductors (e.g. the metallic sheet material), with an extension direction being substantially perpendicular to the arrangement direction, a very direct and effective electrical and thermal transfer from the mounting section to the body section can be obtained.

In other embodiments, the extension direction of the layered structure of conductors, in particular of the metallic sheet material, and insulating layers extends substantially parallel to the arrangement direction of the at least one mounting face. Under "substantially perpendicular", angles of 90°+/−10° and in particular of 90°+/−5° may be understood. Under "substantially parallel", angles of 0°+/−10° and in particular of 0°+/−5° may be understood.

The layered structure of conductors (e.g. the metallic sheet material) and preferably also of insulating layers comprises an angled section. With an angled section, the mounting section may be arranged in a specific orientation in respect to a length of the body section, i.e. in respect to a longest dimension of the body section. For example, the body section may have a first end configured for an electrical connection to a power source, e.g. via a socket, a second end opposite the first end and side faces connecting the first end to the second end. The mounting section may be provided at a side face of the body, wherein the heat transfer is improved further. In particular, the angled section is configured such that the length of the body section extends substantially parallel to the arrangement direction. Besides optimizing heat transfer, such an arrangement resembles the arrangement in a variety of traditional light sources.

According to a next exemplary embodiment of the invention, the at least one mounting face is configured for accommodating multiple light-emitting elements arranged along the arrangement direction. The light-emitting elements may for example be arranged along the arrangement direction in a line, in particular in a straight line to represent the extension direction of a filament. The at least one mounting face may comprise at least three alternating contact sections along the arrangement direction, each alternating contact section corresponding to a conductor and being separated by an insulating section. In an embodiment, the alternating contact sections are configured to provide alternating polarities. For instance, the polarities between neighboring contact sections are reversed in respect to each other (such as sequences like +/−/+ or −/+/−). The light-emitting elements may be brought into contact to two contacting sections with different polarities, e.g. light-emitting elements may be brought into contact to two neighboring alternating contacting sections.

For example, multiple light-emitting elements may be arranged along the arrangement direction in a line, e.g. in a "1×N"-configuration. Each light-emitting element of the "1×N"-configuration arranged along the arrangement direction may be in contact to a different pair of alternating contact sections. Configurations with multiple light-emitting elements being in contact to the same pair of alternating contact sections are also possible, e.g. for arrays of light-emitting elements such as "2×N"-configurations, "3×N"-configurations or even larger arrays.

By providing at least three alternating contact sections along the arrangement direction, heat transfer and electrical conduction to light-emitting elements mounted on the mounting faces may be improved in that the number of conductors providing heat transfer and electrical conduction is increased, and heat may in particular be transferred effectively to the body section. For example, in a "1×N"-configuration with N light-emitting elements arranged along the arrangement direction, N+1 contact sections and N+1 conductors may be provided to optimize heat transfer. The support according for the invention therefore may offer improved efficiency and lifetime of light-emitting elements compared to simple columnar shapes of the prior art, in which multiple light-emitting elements are connected in parallel and heat transfer is effected via the same conductors. Providing at least three alternating contact sections also opens the possibility to operate single or multiple light-emitting elements independently of each other.

The lighting device according to the second aspect comprises a support according to the first aspect and at least one light-emitting element mounted along the arrangement direction of the at least one mounting faces. The at least one light-emitting element is in electrical contact to at least two contact sections, for example in that contact patches of the at least one lighting element are in respective electrical contact to the contact sections. An electrical contact and/or mechanical connection may for instance be based on a soldered contact (e.g. by means of solder paste) and/or a contact with a conductive adhesive. The at least one light-emitting element may be operated by applying a voltage to the conductors that are associated with the corresponding contact sections. For instance, the body section may be configured to provide electrical contact to a power source.

Accordingly, in a next embodiment of the invention, the lighting device may further comprise a socket for connection to a power source, wherein the socket is connected to the body section. The socket is in particular a standard socket suitable for the intended application and in particular for the required type of retrofitting. In some embodiments, the socket may be a standard socket of a halogen light bulb and/or a light bulb for automotive applications. One example of such a socket is a H7 socket.

The body section and the mounting section with the at least one mounting face may be arranged to mimic the arrangement of a filament and the mounting in a traditional light source. For instance, the arrangement direction and the arrangement of the light-emitting element(s) in particular correspond to the arrangement of a standard filament such as a halogen filament. When a socket is used, in particular the distance and orientation of the mounting face(s) to the socket may correspond to the distance and orientation of a filament to a socket in a traditional light source.

With the method according to the third aspect, the at least one light-emitting elements is brought into electrical contact to the contact sections, for example in that contact patches of the at least one lighting element are electrically connected to the contact sections. The electrical contact may for example be established by means of soldering, in particular by using solder paste, and/or by using conductive adhesive.

According to an exemplary embodiment of the invention, providing the support may comprise a stacking of metallic sheets. As mentioned above, a layered structure of conductors may be provided by using metallic sheet material such as copper sheets. The stacked metallic sheet material may provide the shape of the body section and/or the mounting section, as well as the conductors for providing electric connection from the body section to the at least one mounting face. In particular, metallic sheet may be stacked on the main faces of the metallic sheets. Insulating layers between the metallic sheets may be disposed to prevent electrical contact between the metallic sheets. In some embodiments, metallic sheet material may be provided as composite material with one or more insulating layers on the main face(s). In another exemplary embodiment, an adhesive is disposed on the metallic sheet material before and/or during stacking to form at least part of the insulating layers between the metallic sheets. By using an adhesive, the metallic sheets may be mechanically connected and insulated from each other simultaneously.

According to another exemplary embodiment of the invention, the metallic sheets are bent to form an angled section. A bending may be performed before the stacking of the sheets such that the sheets are at least partially brought into the shape required for the support. It is also possible that a bending is performed during or after stacking of the metallic sheets. For instance, a stack of metallic sheets with insulated layers disposed in between the metallic sheets may be provided as a composite material or semi-finished product and bent into the shape of the support.

According to another exemplary embodiment of the invention, providing the support comprises a material removal, in particular after a stacking of metallic sheets. For example, metallic sheets in a regular shape such as a rectangular shape may be used for stacking and providing at least part of the body section and/or mounting section. To obtain more complex shapes of the support, for instance the aforementioned triangular cross section of at least sections of the body section, specific shapes of one or more mounting faces such as mounting faces arranged at an angle to each other, etc., material of the metallic sheet material and/or the insulating layers may be removed. For example, the shape of the support may be at least partially obtained by milling, grinding, cutting, and/or etching.

According to another exemplary embodiment of the invention, the mounting of the at least one light-emitting element comprises: removably fixing the at least one light-emitting element on a supporting layer; applying a contact material on the at least one light-emitting element; and applying the at least one light-emitting element fixed on the supporting layer to the at least one mounting face, wherein the contact material connects the at least one light-emitting element to the contact sections. As the mounting face(s) may have a complex shape and may in particular be arranged in a three-dimensional (non-flat) manner, a reliable positioning of solder may not be possible by means of standard techniques such as solder masks, for instance. Solder masks may be difficult to apply to complex shaped and comparably small mounting faces. Further, when solder is disposed near the edge of a mounting face, the positioning and the amount of solder is hard to control. Especially during reflow of the solder, an undesired repositioning of light-emitting elements may therefore occur.

It has been found that it is advantageous to apply contact material such as solder paste on the at least one light emitting element, in particular on contact patches of the at least one light emitting element, for instance when the at least one light emitting element is already fixed on the supporting layer. The supporting layer may be used for a precise positioning of the at least one light-emitting element, wherein the at least one light-emitting element may be connected to the contact sections. For instance, the at least one light-emitting element is applied to the mounting face(s) such that the contact material touches the contact sections. The contact material may be subjected to reflow and/or curing. The supporting layer may be removed before, after or during the reflow and/or curing of the contact material.

According to another exemplary embodiment of the invention, applying the at least one light-emitting element fixed on the supporting layer to the at least one mounting face comprises bending the supporting layer to conform the shape of the at least one mounting face. Bending the supporting layer may in particular be useful to conform the shape of multiple mounting faces, such that light-emitting elements may be mounted on multiple mounting faces simultaneously.

In an embodiment, the light-emitting elements fixed on the supporting layer may be applied by means of SMT techniques. The supporting layer may be picked up by one or more holding devices such as suction nozzles. For instance, for each light-emitting element or groups of light-emitting elements (e.g. with each group corresponding to a mounting face), a holding device may be used. The holding devices may be positioned and rotated in respect to each other to obtain a shape of the supporting layer that corresponds to the shape of the mounting face(s) and to apply the light-emitting elements on the mounting face(s).

According to another exemplary embodiment of the invention, the supporting layer has at least one predetermined bend line. The bend line may for instance correspond to lines separating sections of the supporting layer, wherein each section corresponds to a light-emitting element or a group of light-emitting elements corresponding to a mounting face. By means of bend lines, the precision of the bending of the supporting layer and therefore the precision of the positioning of the light-emitting elements can be significantly improved. Bend lines may for instance be formed by perforations in the supporting layer. Other configurations may also be possible in addition or as alternative, such as a thickness reduction and/or a different material with higher flexibility compared to the remainder of the supporting layer.

According to another exemplary embodiment of the invention, applying the at least one light-emitting element fixed on the supporting layer to the at least one mounting face comprises a cutting of the supporting layer. In an embodiment, the supporting layer may be cut before the light-emitting element(s) are fixed on the supporting layer. For instance, the supporting layer may be cut into segments, wherein each segment supports a group of light-emitting elements. Each group of light-emitting elements may for example correspond to a mounting face, such that strips of supporting layers are obtained that can be applied independently to each mounting face. In another embodiment, the supporting layer may be cut after fixing the light-emitting element(s), but before contact material is applied. In another embodiment, the supporting layer may be cut after the at least one light-emitting element has been fixed and the contact material has been applied.

As a supporting layer, for instance polyimide adhesive tape may be used. The polyimide adhesive tape may be removed after the contact material has been cured, e.g. after a reflow of solder paste used as contact material. In another embodiment, a supporting layer with a curable adhesive layer on the surface may be used, e.g. an UV curable adhesive tape. In this case, the supporting layer can be removed more easily before curing the contact material by exposing the UV curable adhesive to UV light, wherein the light-emitting element(s) may be released from the supporting layer. A curing of the contact material may then be performed without the supporting layer.

The at least one light-emitting element may in particular comprise at least one semiconductor element capable of light emission. In particular, at least one light-emitting element may comprise at least one LED. LEDs may comprise at least one semiconductor element such as a p-n-junction, a diode, and/or a transistor. For instance, the LEDs may be provided in form of separate or combined LED dies and/or LED packages, wherein particular at least one LED may be arranged on a substrate, e.g. a sapphire substrate. An LED package may comprise a wavelength conversion element (e.g. based on phosphor) and/or may comprise at least one optical element such as a diffusing layer, a diffractive element (e.g. a lens) and/or a reflective element (e.g. a reflector cup). The LED or LEDs may for instance be integrated into an LED lead frame.

The support and/or the lighting device according to the invention may in particular be configured for a use in automotive lighting, e.g. as automotive head light.

The features and example embodiments of the invention described above may equally pertain to the different aspects according to the present invention.

It is to be understood that the presentation of the invention in this section is merely by way of examples and non-limiting.

Other features of the invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

DETAILED DESCRIPTION OF THE PREFERRED EMBODIMENTS

The following description serves to deepen the understanding of the present invention and shall be understood to complement and be read together with the description as provided in the above summary section of this specification.

Figure 1:
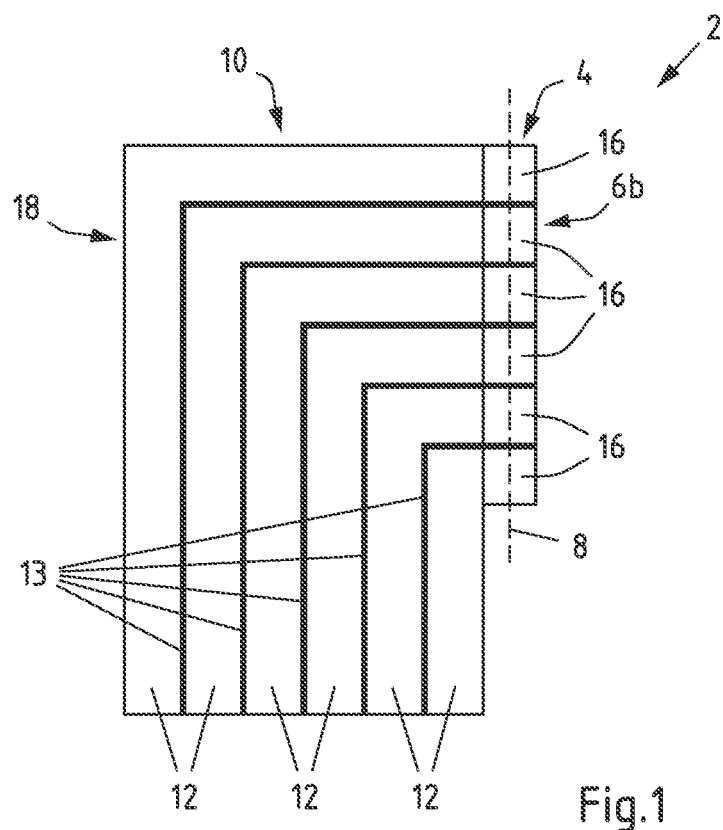
FIG. 1 shows a schematic representation of a first embodiment of a support in a side view.
Figure 2:
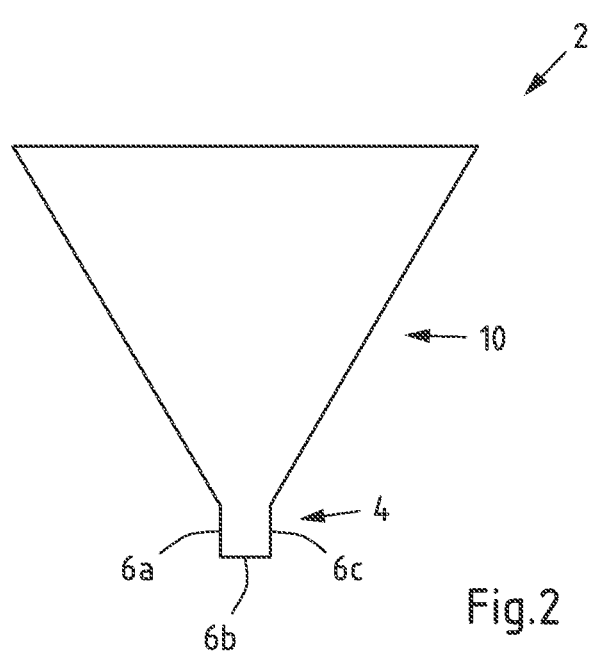
FIG. 2 shows a schematic representation of the first embodiment of a support in a top view.
Figure 3:
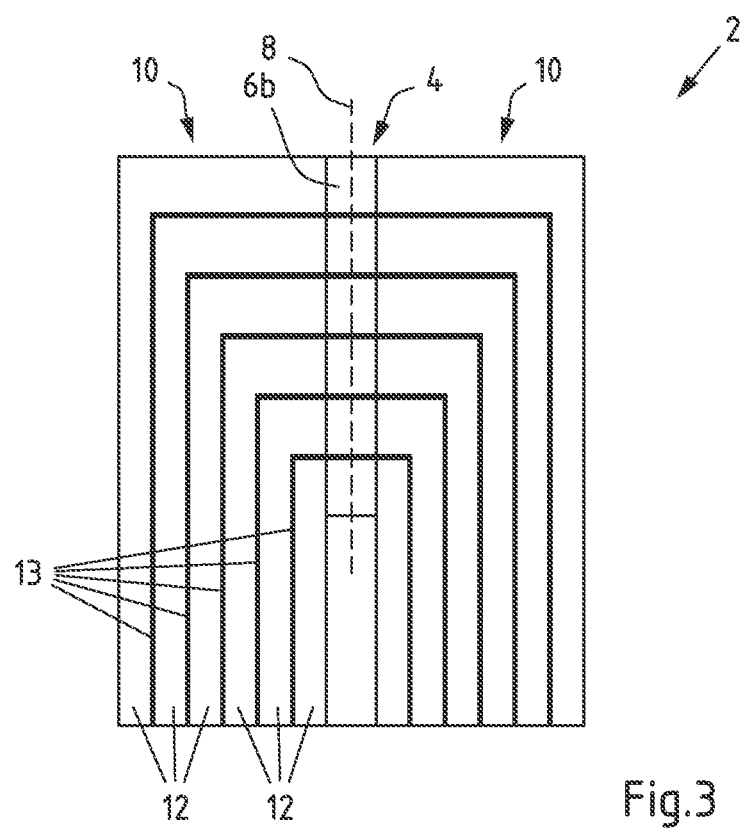
FIG. 3 shows a schematic representation of the first embodiment of a support in a front view.
Figure 4:
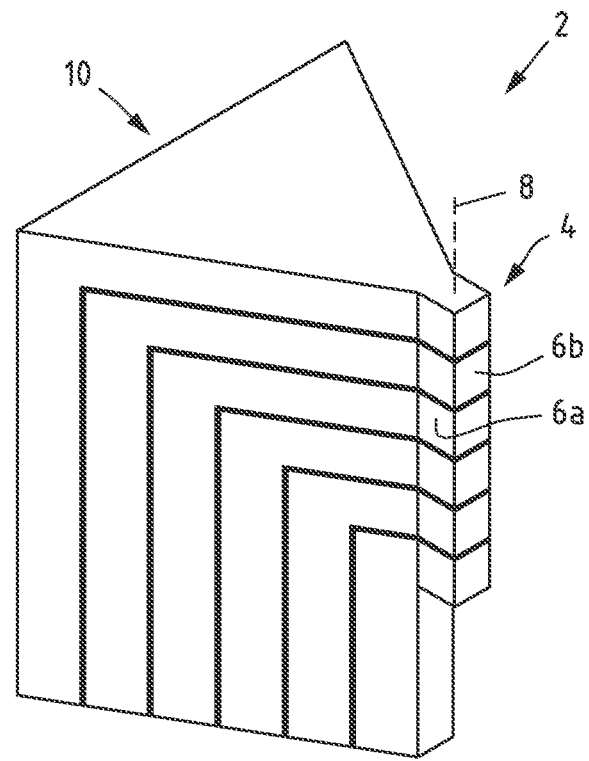
FIG. 4 shows a schematic representation of the first embodiment of a support in a perspective view.

FIGS. 1, 2, and 3 show schematic representations of a first embodiment of a support 2 for at least one light-emitting element in a side view, top view, and front view, respectively. In FIG. 4, the first embodiment of a support 2 is shown in a perspective view.

As can be seen in particular in FIGS. 1 and 2, the support 2 comprises a mounting section 4 with three mounting faces 6a, 6b, 6c, wherein the mounting faces 6a, 6b, 6c have an arrangement direction 8. The mounting faces 6a, 6b, 6c are configured for accommodating light-emitting elements arranged along the arrangement direction 8. The mounting face 6b is arranged between the other two mounting surfaces 6a, 6c and is arranged substantially perpendicular to the other two mounting surfaces 6a, 6c.

A body section 10 is arranged adjacent to the mounting section 4 and is in thermal contact to the mounting section 4. The support 2 comprises conductors 12 for providing electric connection from the body section 10 to the mounting faces 6a, 6b, 6c, such that light-emitting elements may be provided with electrical power by connecting the body section 10 to a power source. The mounting section 4 and body section 10 comprise a layered structure of conductors 12 formed from metallic sheet material, in particular sheet material based on copper, and insulating layers 13 disposed in between the conductors 12.

An extension direction of the metallic sheet material forming the conductors 12 and the insulating layers 13 extends substantially perpendicular to the arrangement direction 8 of the mounting faces 6a, 6b, 6c in the mounting section. In part of the body section 10, the extension direction extends substantially parallel to the arrangement direction 8. The layered structure of conductors 12 and insulating layers 13 comprises an angled section 18, wherein a length of the body section 10 extends substantially parallel to the arrangement direction 8.

As can be seen in FIG. 1, the mounting faces 6a, 6b, 6c comprise contact sections 16 along the arrangement direction 8, each contact section 16 corresponding to a conductor 12 and being separated by an insulating section formed by the insulation layers 13. The metallic sheet material forming the conductors 12 comprises a main face and side faces, wherein each of the contact sections 16 is respectively formed by a side face of metallic sheet material.

As can be seen in particular from the front view in FIG. 3, the body section 10 protrudes sidewards from the mounting faces 6a, 6b, 6c relative to the arrangement direction 8. For instance, when a viewer faces the mounting face 6b, the body section extends beyond the edges of the mounting faces 6a, 6b, 6c. That is, the body section 10 has an increased width in comparison to the mounting section 4.

The body section 10 has an increasing cross-sectional area with increasing distance from the mounting section 4, which is in particular apparent from the top view in FIG. 2. The body section 10 has a triangular cross section with the mounting section 4 being arranged on an edge of the triangular cross section. The triangular cross section has an opening angle of 45°. As already mentioned above, the body section may provide an electrical connection to the at least one mounting face and may act simultaneously as a heat sink as well as a heat conductor, which is particularly advantageous when light-emitting elements with a high heat output are used, e.g. LED light sources for applications such as automotive head lighting. As the body section 10 protrudes sidewards from the mounting faces 6a, 6b, 6c, the volume of the body section 10 is enlarged, and the body section 10 provides significantly improved heat transfer from the mounting section 4 while at the same time providing effective electrical conductivity and optical properties suitable for retrofitting applications.

In particular, the illumination pattern of light sources such as halogen bulbs may be reproduced very closely with light-emitting elements mounted in the mounting faces 6a, 6b, 6c of the support 2. Each of the mounting faces 6a, 6b, 6c is configured for accommodating multiple light-emitting elements arranged along the arrangement direction 8. In this first embodiment, the mounting faces 6a, 6b, 6c each comprise six contact sections 16 along the arrangement direction 8, each contact section 16 corresponding to a conductor 12 and being separated by an insulating section 13. The arrangement direction may correspond to the extension direction of a filament in an incandescent light source.

Figure 5:
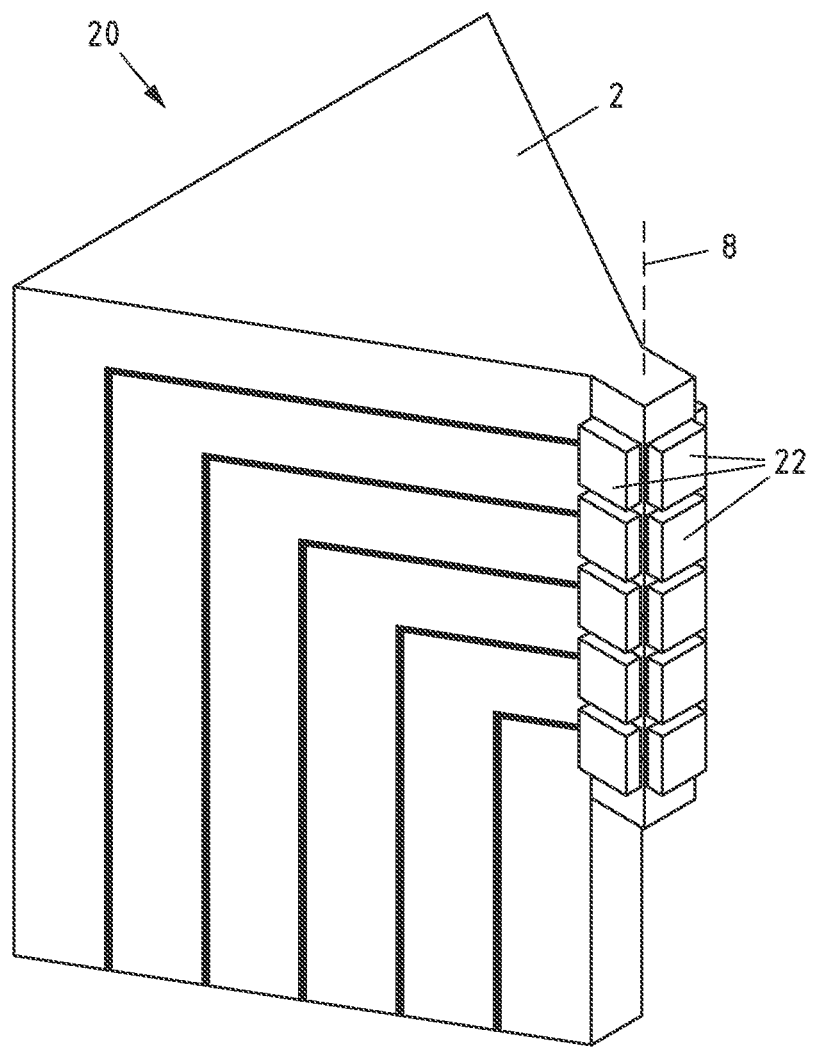
FIG. 5 shows a schematic representation of a first embodiment of a lighting device in a perspective view.

A first embodiment of a lighting device 20 according to the invention is shown in FIG. 5, wherein the lighting device 20 comprises the first embodiment of a support 2 as depicted in FIGS. 1-4. Five light-emitting elements 22 are mounted along the arrangement direction 8 of each mounting face 6a, 6b, 6c. Each light-emitting element 22 is in electrical contact to two neighboring (alternating) contact sections 16.

Figure 6:
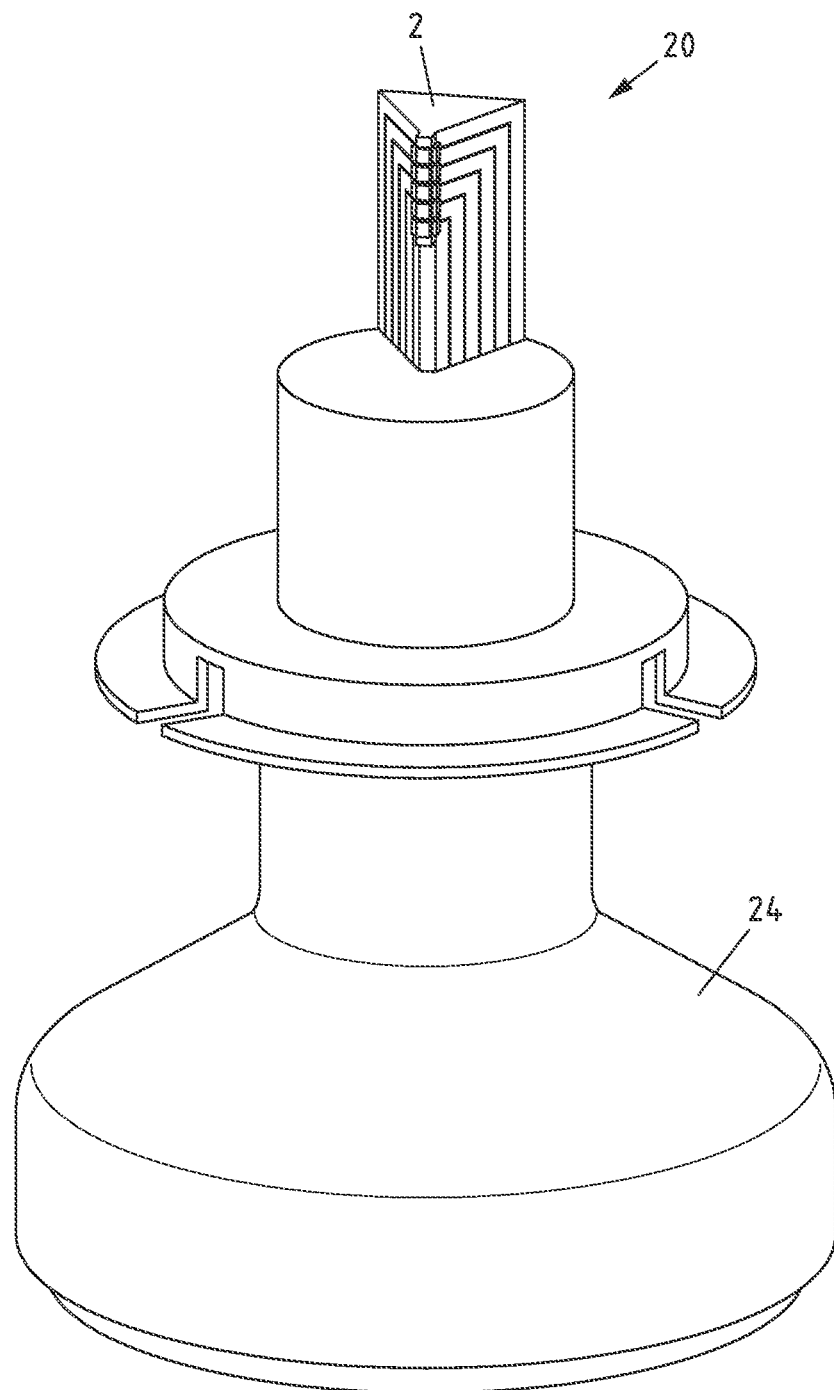
FIG. 6 shows a schematic representation of a second embodiment of a lighting device in a perspective view.

In FIG. 6, a second embodiment of a lighting device 20 according to the invention is shown, wherein a socket 24 for connection to a power source is provided, wherein the socket 24 is connected to the body section 10 of the support 2. The support 2 is configured according to the first embodiment shown in FIGS. 1-4. The socket 24 represents a standard socket corresponding to a H7 halogen lamp in automobile applications.

FIG. 7 to FIG. 12 show respective further embodiments of a lighting device 20 according to the invention, wherein in contrast to the first embodiment of the invention shown in FIG. 5, a different control of the conductors 12a to 12f is illustrated enabling other functions of the multiple lighting functions of the lighting device 20, and/or comprising optional further structural features.

Figure 7:
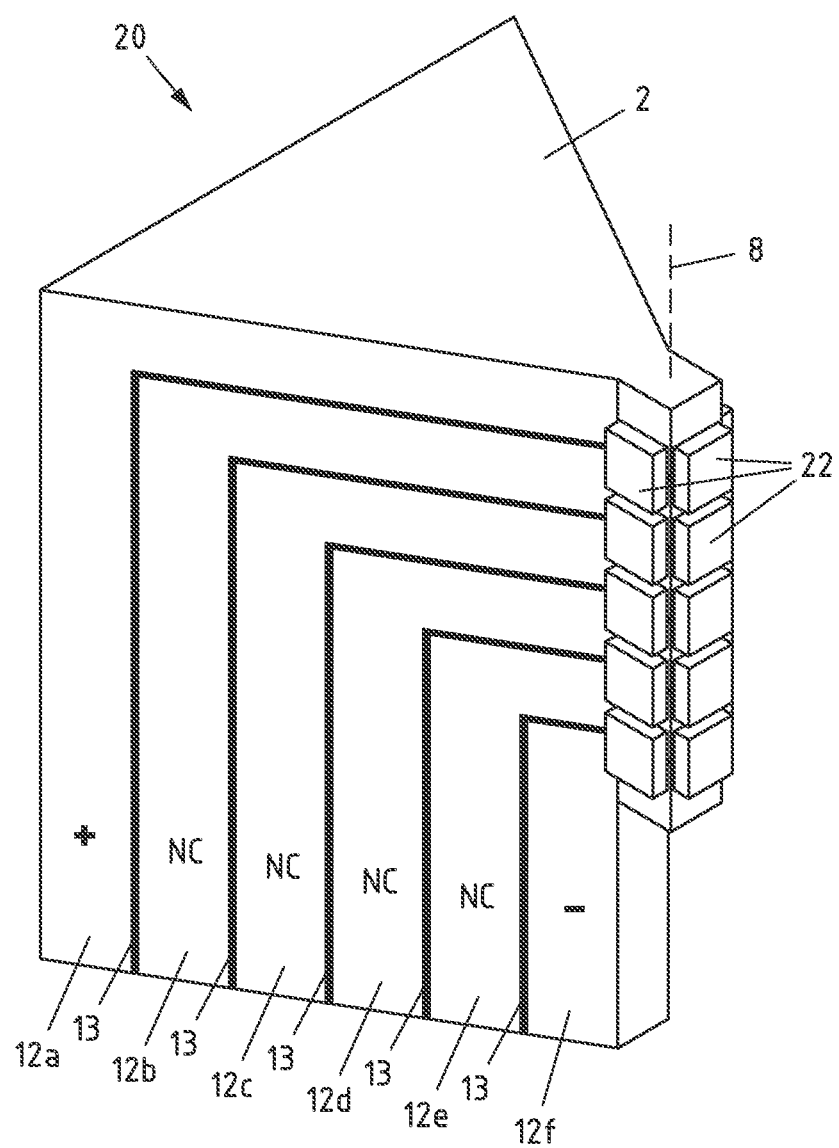
FIG. 7 shows a schematic representation of a second embodiment of a lighting device in a perspective view.

FIG. 7 shows an embodiment of the present invention that is based on the lighting device shown in FIG. 5. Each contact section 16 corresponds to a conductor 12a to 12f. Between two neighboring contact sections corresponding to the conductors 12a to 12f, a respective insulating section 13 is comprised by the support 2. Each light-emitting element 22 is a LED die. In order to enable multiple lighting functions, such as low beam, DRL, PL, or a combination thereof, and/or providing beam dynamics, such as boosting, dimming, fast switching, or a combination thereof, one or more voltages can be applied to any combination of the conductors 12a to 12f resulting in one or more voltages being applied to the LED dies. The one or more voltages may for instance be applied in a timely manner, e.g. in certain pre-defined time intervals, e.g. resulting in a running light enabled by the support. As shown in FIG. 5, conductor 12a is applied with a + polarity, conductor 12f is applied with a − polarity, while conductors 12b to 12 e are not connected (as indicated by 'NC'). This may for instance result in that all of the LED dies 22 of the example embodiment shown in FIG. 5 emit light as defined by the respective LED dies 22.

Figure 8:
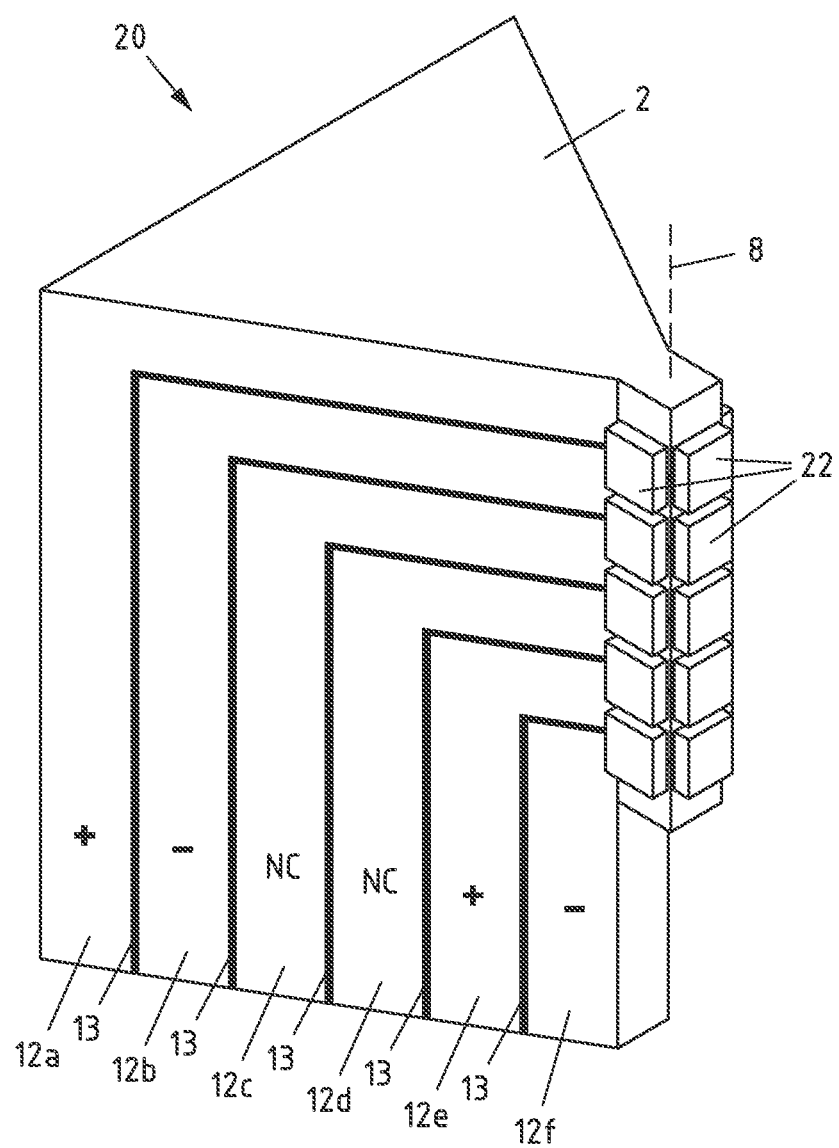
FIG. 8 shows a schematic representation of a third embodiment of a lighting device in a perspective view.

In FIG. 8, conductors 12a and 12b are applied with a voltage of alternating polarity (12a: + polarity, and 12b: − polarity), conductors 12e and 12f are applied with a second voltage (e.g. different from voltage applied to conductors 12a, 12b) of alternating polarity (12e: + polarity, and 12f: − polarity), and conductors 12c and 12d are not connected (as indicated by 'NC'), resulting in that LED dies 22 coupled to the conductors 12a and 12b are switched on, and further, the LED dies 22 coupled to the conductors 12e and 12f are switched on, while the other LED dies 22 are switched off as well.

Figure 9:
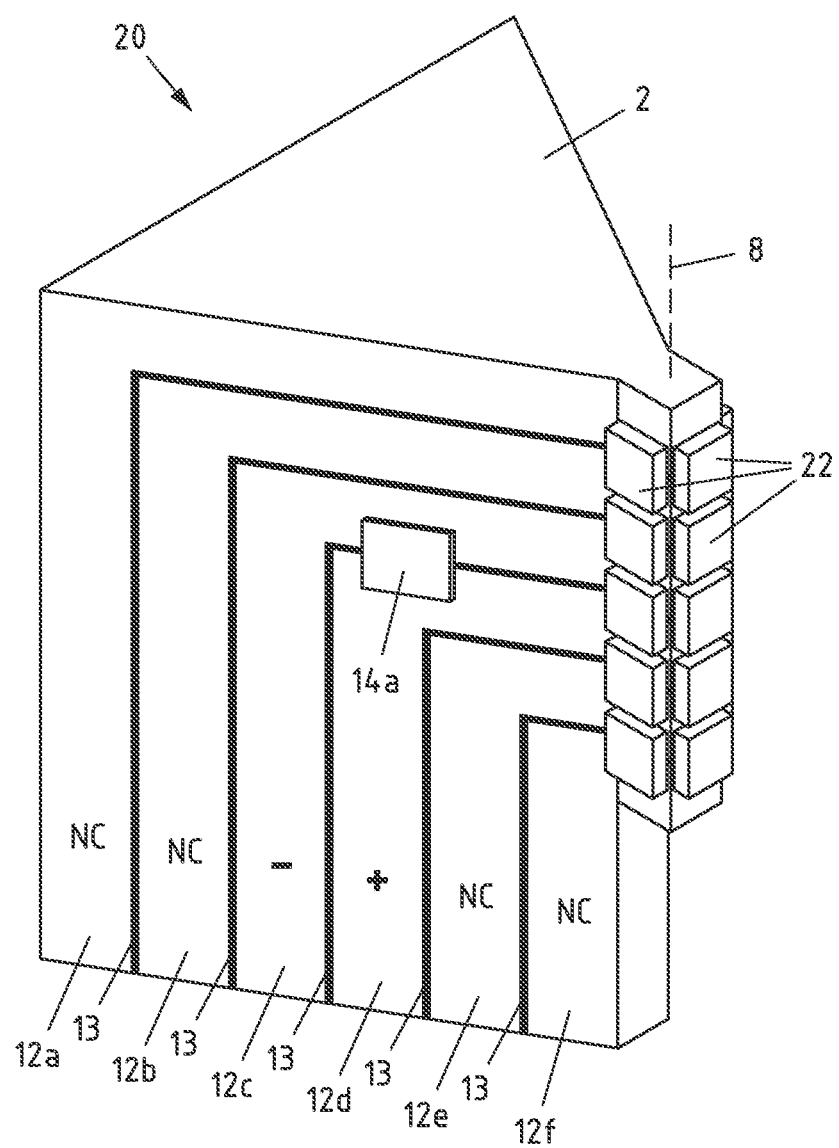
FIG. 9 shows a schematic representation of a fourth embodiment of a lighting device in a perspective view.

The example embodiment of a support 2 shown in FIG. 9 comprises an optional sensor 14a, wherein the sensor in FIG. 9 is a temperature sensor 14a and is mounted on the side of the support 2. Via the conductors 12c and 12d, information gathered by the temperature sensor 14a (e.g. temperature information indicative of a temperature value measured in the vicinity of the LED dies 22) can be read. Conductors 12c and 12d are applied with a voltage of alternating polarity (12c: − polarity, and 12d: + polarity), while the conductors 12a, 12b, and 12e, 12f are not connected (as indicated by 'NC'). With this controlling of the conductors, information gathered by the temperature sensor 14a may be read. In case e.g. information of the temperature sensor 14b should not be read, the conductors 12c and 12d applied with a respective voltage as shown, can result in the respective LED dies connected via the conductors 12c, 12d being switched on.

Figure 11:
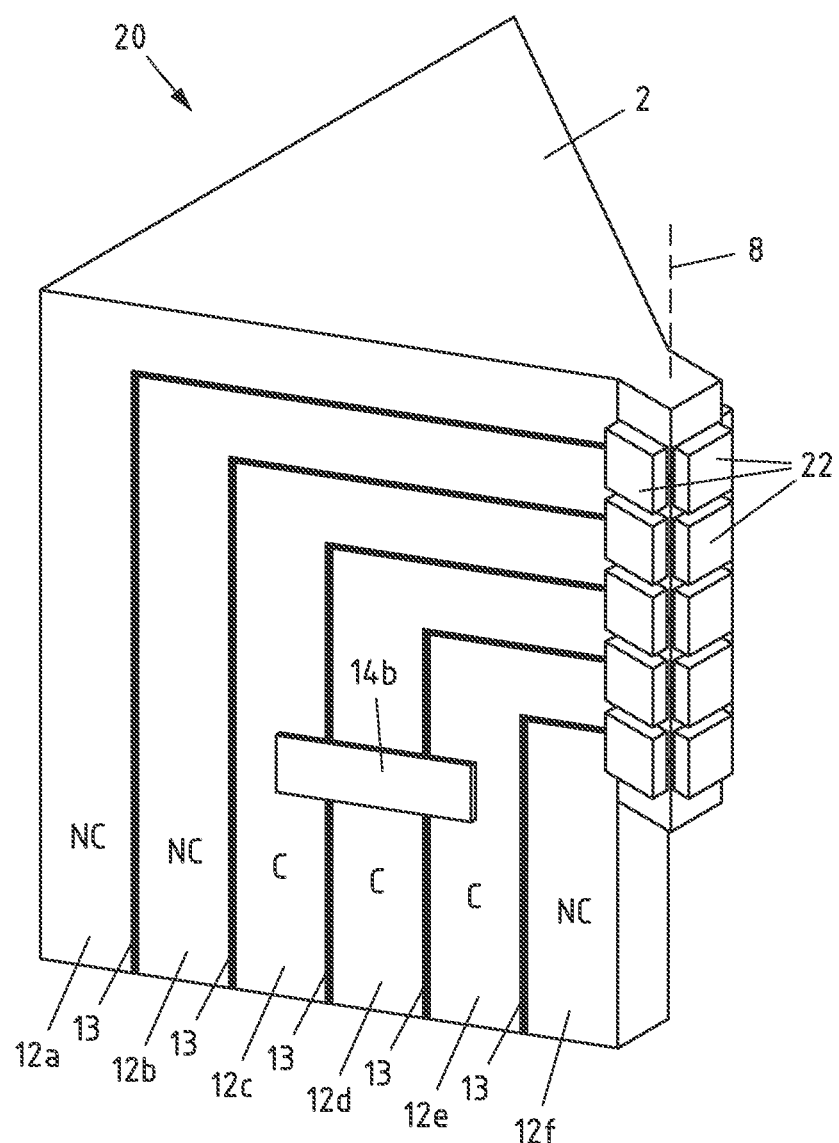
FIG. 11 shows a schematic representation of a sixth embodiment of a lighting device in a perspective view.

In contrast, in FIG. 11, another sensor 14b, e.g. a temperature sensor is comprised by the support, wherein this sensor 14b is located on a side of the support and is coupled to the conductors 12c, 12d, and 12e. Via this coupling, e.g. information gathered by the sensor 14b, and/or controlling of the sensor 14b is enabled.

Figure 12:
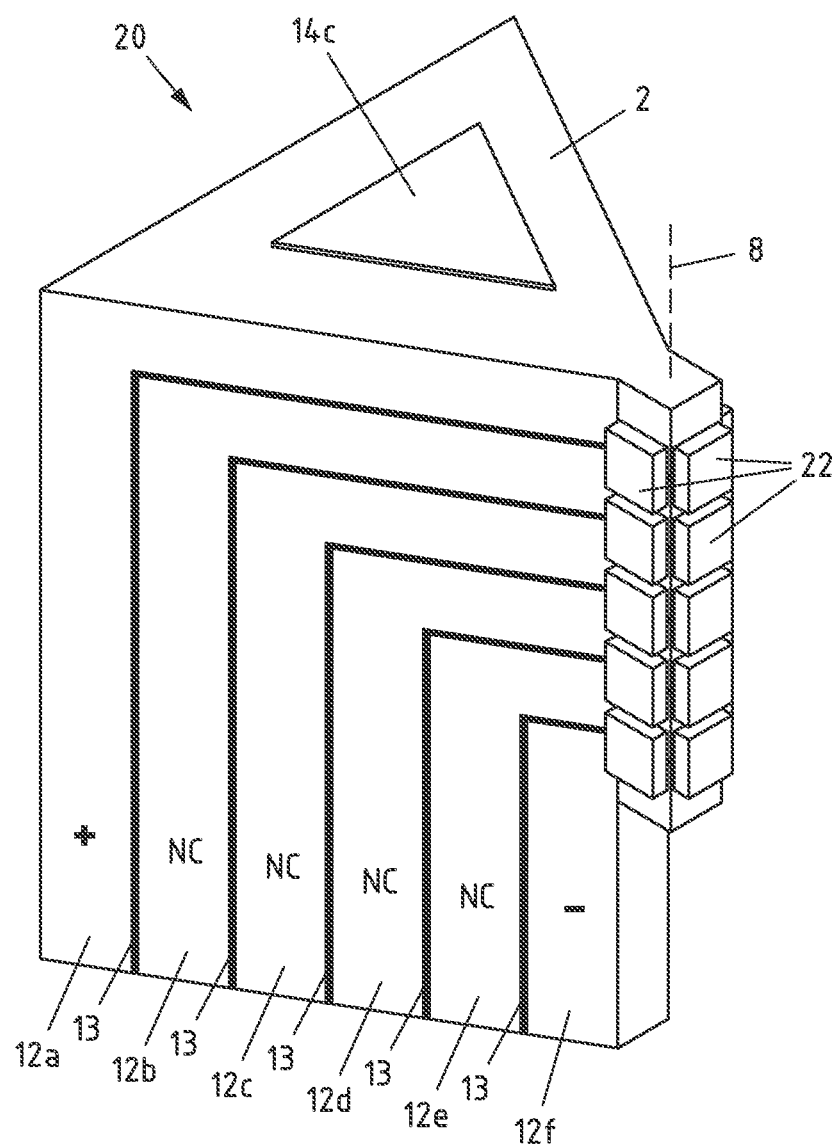
FIG. 12 shows a schematic representation of a seventh embodiment of a lighting device in a perspective view.

In FIG. 12, a further sensor 14c, e.g. a temperature sensor 14c is comprised on a top side of the support. In this embodiment, the respective sensor 14c is coupled via the conductor 12a enabling information gathered by the respective sensor 14c (e.g. as disclosed above) at least to be read and/or to control the respective sensor 14c accordingly.

Figure 10:
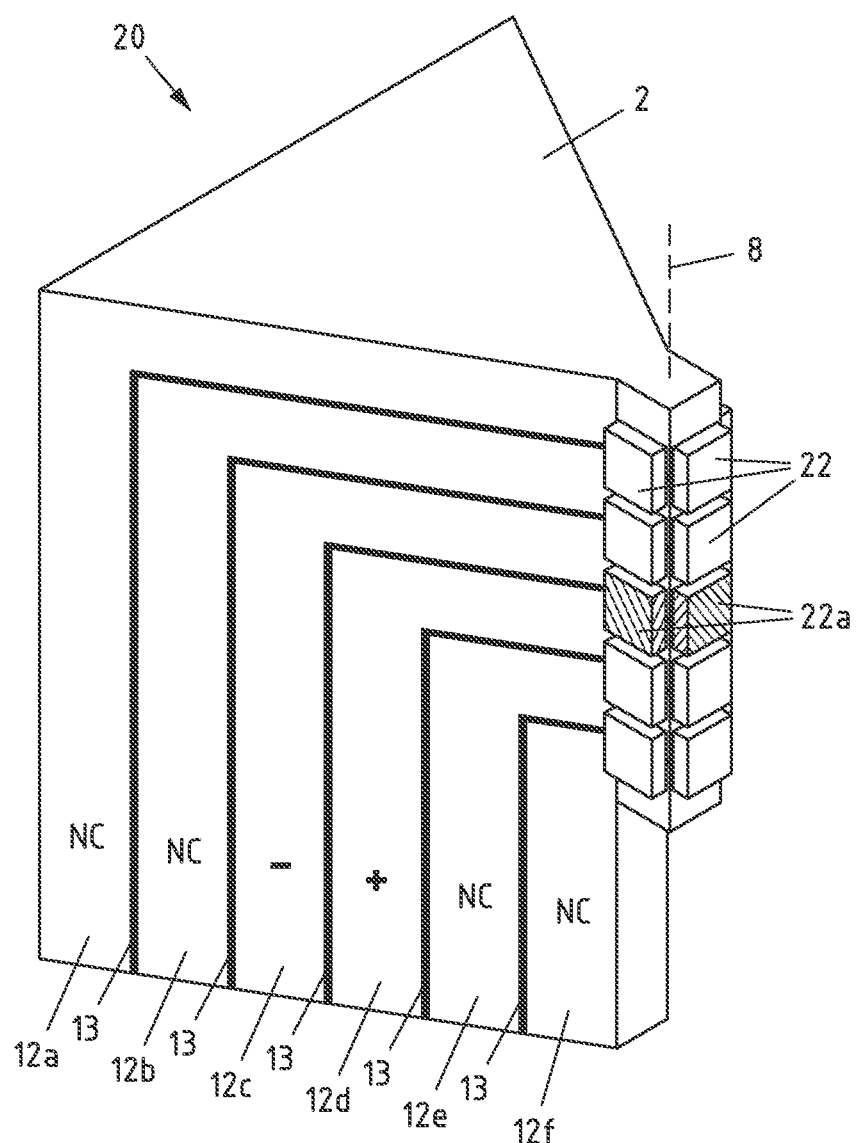
FIG. 10 shows a schematic representation of a fifth embodiment of a lighting device in a perspective view.

In FIG. 10, the LED dies 22 comprise a specific LED die 22a, which may be a LED die enabled to emit light of a wavelength resulting in the color of yellow and/or blue. In this way, e.g. emitting of cold-white or warm-white light may be enabled.

Example embodiment according to all exemplary aspects of the present invention enable one or more of the following features: each Cu (copper)-Stripe is an electrical port (e.g. conductor); addressing LED dies individually or in groups (all LEDs on) is enabled; addressing LEDs individually or in groups (welcome mode) is enabled; placing additional LEDs at different locations (e.g. a LED of another color, such as a blue LED) is enabled; and using polarity of LEDs to realize dual or multiple functions (e.g. turning LEDs on in a sequential, thus timely different manner) is enabled.

Between connectors, polarity may be different (prior art: higher order connector has higher potential). Further, LED dies can be turned off, sensor(s) are enabled, and/or other LED dies can be operated selectively. In a normal operation of example embodiments of the invention, all LED dies are operated in series (e.g. connector 1 has positive potential, last connector has negative potential, all connectors in between are isolated, thus series operation is realized).

FIG. 13a-d show schematic illustrations of a method for producing a lighting device according to the invention and in particular for producing the lighting device according to the first embodiment.

A support 2 is provided, e.g. configured according to the first embodiment shown in FIGS. 1-4. The support 2 may be provided by stacking of metallic sheets and disposing insulating layers between the metallic sheets, wherein the insulating layers can be formed by adhesive applied to the metallic sheets. The metallic sheets may be bent to form an angled section with a substantially perpendicular angle and a material removal may be performed to obtain a shape of the support 2 as depicted in FIGS. 1-4.

Figure 13A:
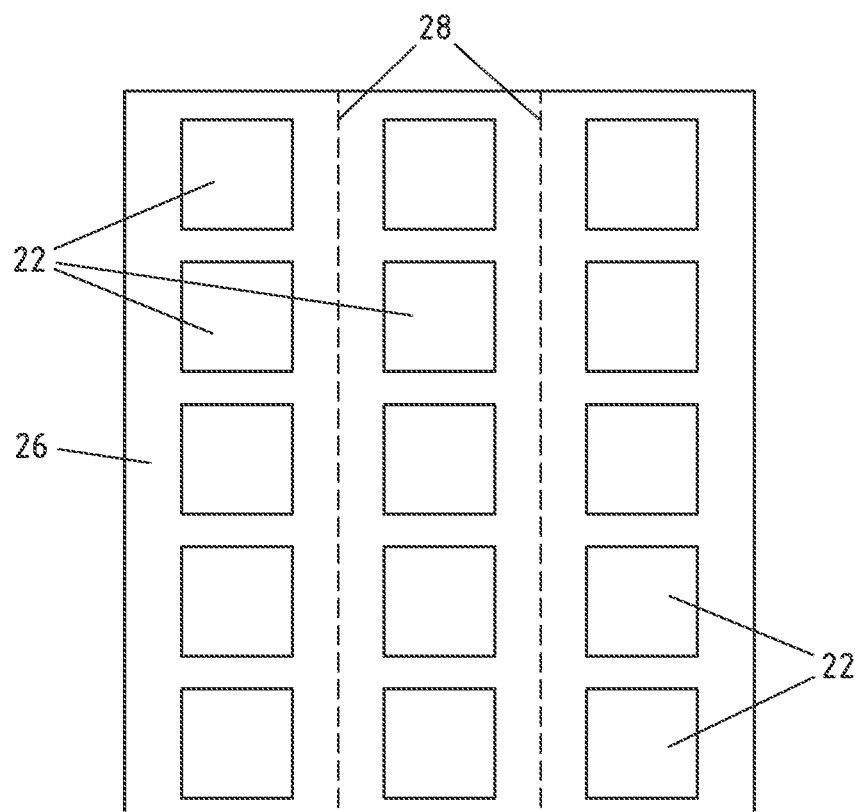
FIG. 13a-d show schematic representations of an embodiment of a method for producing a lighting device.
Figure 13B:
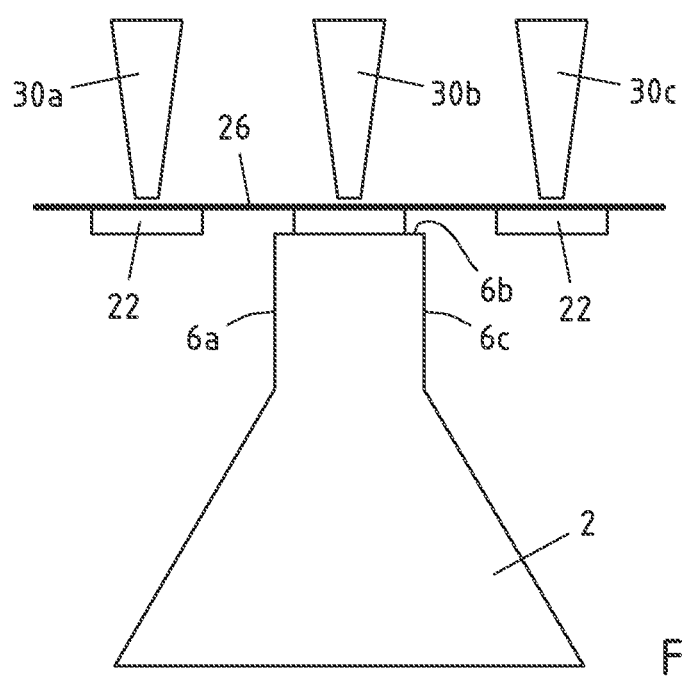

Light-emitting elements 22 are then mounted on the support 2 as shown in FIG. 13a-d. FIG. 13a represents a front view, wherein the light emitting elements 22 are removably fixed on a supporting layer 26, for instance an adhesive polyimide tape or an UV curable adhesive tape. The supporting layer 26 has predetermined bend lines in form of perforations 28 that divide the light-emitting elements 22 into groups, each group corresponding to a mounting face 6a, 6b, 6c. Solder paste as a contact material is applied on contact sections of the light-emitting elements 22 (not shown).

Figure 13C:
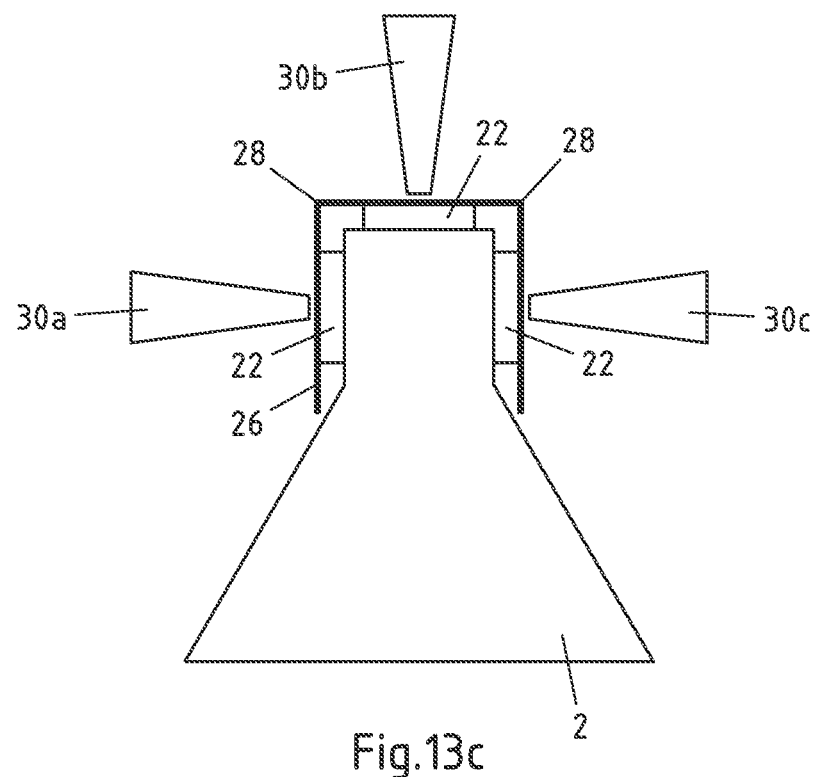

The supporting layer 26 is picked up by suction nozzles 30a, 30b, 30c of a holding device. Three suction nozzles 30a, 30b, 30c or three groups of suction nozzles 30a, 30b, 30c are used, each corresponding to a group of light-emitting elements 22 and a mounting face 6a, 6b, 6c. After the light-emitting elements 22 corresponding to mounting face 6*b* have been applied, as shown in a top view of the support 2 in FIG. 13*b*, the suction nozzles 30*a*, 30*c* are repositioned and rotated such that the supporting layer 26 is bent at the perforations 28 to conform the shape of the mounting faces 6*a*, 6*b*, 6*c*, as shown in FIG. 13*c*.

As an alternative, the supporting layer 26 may be cut into strips, each strip corresponding to a mounting face 6*a*, 6*b*, 6*c* (not shown) and the strips are applied in a similar manner.

Figure 13D:
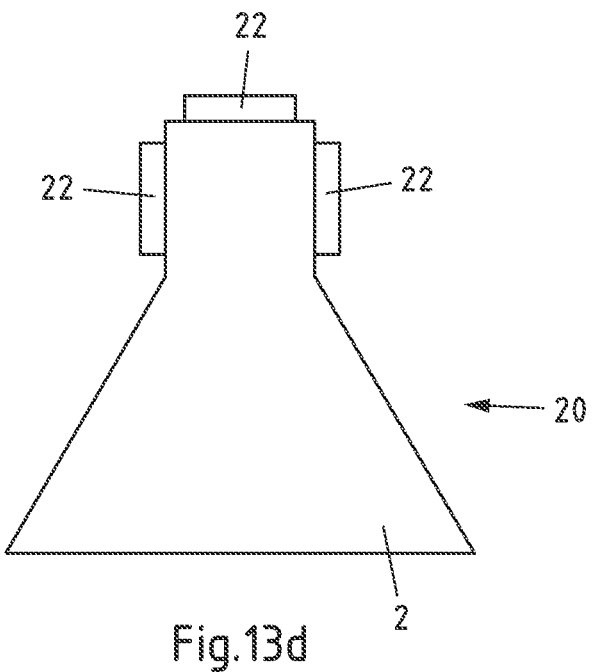

The solder paste is subjected to a reflow after positioning of the light-emitting elements 22 such that the solder paste permanently connects the light-emitting elements 22 to the contact sections 16 of the mounting faces 6*a*, 6*b*, 6*c*. The supporting layer 22 may be removed from the light-emitting elements after reflow (e.g. when adhesive polyimide tape is used) or before reflow (e.g. when using UV curable adhesive tape that can be exposed to UV light to reduce adhesion to the light-emitting elements 22). A light-emitting device 20 is obtained as shown in FIG. 13*d*. Example embodiments of the present invention enable e.g. an architecture that is 100% compatible to the H7 architecture of car lights. Further, it is possible to incorporate multiple lighting functions (low beam, DRL (Daytime Running Light), PL (Position Light), etc.) and/or providing beam dynamics (boosting, dimming, fast switching, etc.) with the same retro fit lighting module by enabling that a voltage can be applied between any of the contact sections when connected to a power source.

A support for light-emitting elements may comprise a mounting section (4) with at least one mounting face (6*a*, 6*b*, 6*c*). The at least one mounting face (6*a*, 6*b*, 6*c*) may be arranged in an arrangement direction (8) and may be configured for accommodating at least one light-emitting element (22) arranged along the arrangement direction (8). The support may comprise a body section (10) arranged adjacent to the mounting section (4). The support may comprise conductors (12) for providing electric connection from the body section (10) to the at least one mounting face (6*a*, 6*b*, 6*c*). The at least one mounting face (6*a*, 6*b*, 6*c*) may comprise at least two contact sections (16) along the arrangement direction (8). Each contact section may correspond to a conductor (12). The body section (10) may protrude sidewards from the at least one mounting face (6*a*, 6*b*, 6*c*).

The body section (10) may be at least in sections an increasing cross-sectional area with increasing distance from the mounting section (4), in particular a triangular cross section at least in sections with the mounting section (4) being arranged on an edge of the triangular cross section. The triangular cross section may have an opening angle of 0° to 90°, in particular 30° to 45°.

The mounting section (4) and/or body section (10) may comprise a layered structure of conductors (12) and insulating layers (13).

The conductors (12) may comprise a metallic sheet material. The metallic sheet material may be based on copper.

The metallic sheet material may comprise a main face and side faces. Each of the contact sections (16) may be respectively at least partially formed by a side face of the metallic sheet material.

An extension direction of the layered structure of conductors (12), in particular of the metallic sheet material, and insulating layers (13) in the mounting section (4) may extend substantially perpendicular or substantially parallel to the arrangement direction (8) of the at least one mounting face.

The layered structure of conductors (12) and insulating layers (13) may comprise an angled section (18). A length of the body section (10) may extend substantially parallel to the arrangement direction (8).

The mounting section (4) may comprise at least two mounting faces (6*a*, 6*b*, 6*c*) being arranged adjacent to each other. At least two mounting faces (6*a*, 6*b*, 6*c*) may be arranged at an angle to each other or substantially parallel to each other.

The mounting section (4) may comprise three mounting faces (6*a*, 6*b*, 6*c*). One of the three mounting faces (6*b*) may be arranged between the other two mounting surfaces (6*a*, 6*c*). One of the three mounting faces (6*b*) may be arranged between the other two mounting surfaces (6*a*, 6*c*) with an enclosing angle of 45° to 135°, in particular 45° to 75° or substantially perpendicular to the other two mounting surfaces (6*a*, 6*c*).

The at least one mounting face (6*a*, 6*b*, 6*c*) may be configured for accommodating multiple light-emitting elements (22) arranged along the arrangement direction (8). The at least one mounting face (6*a*, 6*b*, 6*c*) may comprise at least three alternating contact sections (16) along the arrangement direction (8). Each alternating contact section (16) may correspond to a conductor (12) and may be separated by an insulating section.

A lighting device may comprise a support (2) according to any of embodiments discussed herein. The lighting device may comprise at least one light-emitting element (22) mounted along the arrangement direction (8) of at least one mounting face (6*a*, 6*b*, 6*c*). The at least one light-emitting element (22) may be in electrical contact to at the least two contact sections (16).

The lighting device may comprise a socket (24) for connection to a power source. The socket (24) may be connected to the body section (10).

A method for producing a lighting device (20) may comprise providing a support (2) according to any of the embodiments discussed herein. The method may comprise mounting at least one light-emitting element (22) along an arrangement direction (8) of at least one mounting face (6*a*, 6*b*, 6*c*). The at least one light-emitting element (22) may be brought into electrical contact to a contact sections (16).

The method may comprise a stacking of metallic sheets and disposing insulating layers (13) between the metallic sheets. The metallic sheets may be bent to form an angled section (18). The angled section may be a substantially perpendicular angle.

The method may comprise a material removal, in particular after a stacking of metallic sheets.

The mounting of the at least one light-emitting element (22) may comprise removably fixing the at least one light-emitting element (22) on a supporting layer (26). The mounting may comprise applying a contact material on the at least one light-emitting element (22). The mounting may comprise applying the at least one light-emitting element (22) fixed on the supporting layer (26) to the at least one mounting face (6*a*, 6*b*, 6*c*). The contact material may connect the at least one light-emitting element (22) to the contact sections (16).

Applying the at least one light-emitting element (22) fixed on the supporting layer (26) to the at least one mounting face (6*a*, 6*b*, 6*c*) may comprise bending the supporting layer (26) to conform to the shape of the at least one mounting face (6*a*, 6*b*, 6*c*). The supporting layer (26) may have at least one predetermined bend line (28). The bend line may be a material weakening such as a material reduction or a perforation. Applying the at least one light-emitting element

(22) fixed on the supporting layer (26) to the at least one mounting face (6a, 6b, 6c) may comprise a cutting of the supporting layer (26).

In the present specification, any presented connection in the described embodiments is to be understood in a way that the involved components are operationally coupled. Thus, the connections can be direct or indirect with any number or combination of intervening elements, and there may be merely a functional relationship between the components.

Moreover, any of the methods, processes and actions described or illustrated herein may be implemented using executable instructions in a general-purpose or special-purpose processor and stored on a computer-readable storage medium (e.g., disk, memory, or the like) to be executed by such a processor. References to a 'computer-readable storage medium' should be understood to encompass specialized circuits such as FPGAs, ASICs, signal processing devices, and other devices.

The expression "A and/or B" is considered to comprise any one of the following three scenarios: (i) A, (ii) B, (iii) A and B. Furthermore, the article "a" is not to be understood as "one", i.e. use of the expression "an element" does not preclude that also further elements are present. The term "comprising" is to be understood in an open sense, i.e. in a way that an object that "comprises an element A" may also comprise further elements in addition to element A.

It will be understood that all presented embodiments are only exemplary, and that any feature presented for a particular example embodiment may be used with any aspect of the invention on its own or in combination with any feature presented for the same or another particular example embodiment and/or in combination with any other feature not mentioned. In particular, the example embodiments presented in this specification shall also be understood to be disclosed in all possible combinations with each other, as far as it is technically reasonable and the example embodiments are not alternatives with respect to each other. It will further be understood that any feature presented for an example embodiment in a particular category (method/apparatus/computer program/system) may also be used in a corresponding manner in an example embodiment of any other category. It should also be understood that presence of a feature in the presented example embodiments shall not necessarily mean that this feature forms an essential feature of the invention and cannot be omitted or substituted.

The statement of a feature comprises at least one of the subsequently enumerated features is not mandatory in the way that the feature comprises all subsequently enumerated features, or at least one feature of the plurality of the subsequently enumerated features. Also, a selection of the enumerated features in any combination or a selection of only one of the enumerated features is possible. The specific combination of all subsequently enumerated features may as well be considered. Also, a plurality of only one of the enumerated features may be possible.

The sequence of all method steps presented above is not mandatory, also alternative sequences may be possible. Nevertheless, the specific sequence of method steps exemplarily shown in the figures shall be considered as one possible sequence of method steps for the respective embodiment described by the respective figure.

The invention has been described above by means of example embodiments. It should be noted that there are alternative ways and variations which are obvious to a skilled person in the art and can be implemented without deviating from the scope of the appended claims.

What is claimed is:

1. A support for light-emitting elements, the support comprising:
a mounting section comprising at least one mounting face, the at least one mounting face having an arrangement direction, being configured to accommodate at least one light-emitting element along the arrangement direction, and comprising at least two contact sections along the arrangement direction;
a body section adjacent to the mounting section and having a length that extends parallel to the arrangement direction, such that the body section protrudes sidewards from the at least one mounting face; and
a plurality of conductors connecting the body section to the at least one mounting face, such that each contact section corresponds to a conductor, the plurality of conductors being a layered structure of conductors such that an extension direction of the layered structure of the conductors extends substantially perpendicular to the arrangement direction of the at least one mounting face, the layered structure of conductors comprising an angled section.

2. The support of claim 1 further comprising:
an insulating section separating two neighboring contact sections of the at least two contact sections.

3. The support of claim 1, wherein a voltage is applied between any of the at least two contact sections when the body section is connected to a power source.

4. The support of claim 3, wherein a further voltage is applied between any of at least two further contact sections of the at least two contact sections when the body section is connected to a power source.

5. The support of claim 1, wherein at least one contact section is not connected so that a voltage is not applied to the at least one contact section when the body section is connected to a power source.

6. The support of claim 1 wherein:
the body section further comprises at least one sensor and is coupled to at least two contact sections so that information gathered by the at least one sensor is at least readable via the coupling.

7. The support of claim 6, wherein the at least one sensor is located on a top side, or on at least one side, or on both a top side and at least one side of at least three sides of the body section connected at least partially via the top side with each other.

8. The support of claim 7, wherein the at least one sensor is at least one temperature sensor configured to gather a temperature of the support.

9. The support of claim 1, wherein the at least one mounting face is configured for accommodating multiple light-emitting elements arranged along the arrangement direction.

10. The support of claim 1, wherein the mounting section comprises at least two mounting faces being arranged adjacent to each other;
and wherein at least two mounting faces are arranged at an angle to each other or substantially parallel to each other.

11. The support of claim 1, wherein the mounting section comprises at least two mounting faces being arranged at an angle to each other or substantially parallel to each other.

12. The support of claim 1, wherein the mounting section comprises three mounting faces, one of the three mounting faces being arranged between the other two mounting faces.

13. The support of claim 12, wherein the one of the three mounting faces is arranged between the other two mounting faces with an enclosing angle of 45° to 135°.

14. The support of claim 12, wherein the one of the three mounting faces is arranged substantially perpendicular to the other two mounting faces.

15. The support of claim 1, wherein the support comprised at least two light-emitting elements, wherein at least one light-emitting element is configured to emit a light of different wavelength than another light-emitting element.

16. The support of claim 15, wherein the at least one light-emitting element configured to emit a light of different wavelength is further configured to emit a light with a wavelength representing a color of yellow or blue.

* * * * *